United States Patent
Hong et al.

(10) Patent No.: US 11,588,301 B2
(45) Date of Patent: Feb. 21, 2023

(54) VERTICAL CAVITY SURFACE EMITTING LASER DEVICE

(71) Applicant: Lextar Electronics Corporation, Hsinchu (TW)

(72) Inventors: Chung-Yu Hong, Hsinchu (TW); Yu-Chen Lin, Hsinchu (TW); Gang-Wei Fan, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 234 days.

(21) Appl. No.: 17/033,963

(22) Filed: Sep. 28, 2020

(65) Prior Publication Data

US 2021/0143614 A1 May 13, 2021

(30) Foreign Application Priority Data

Nov. 11, 2019 (CN) .......................... 201911096307.5

(51) Int. Cl.
*H01S 5/024* (2006.01)
*H01S 5/42* (2006.01)
*H01S 5/183* (2006.01)
*H01S 5/02* (2006.01)

(52) U.S. Cl.
CPC ............ *H01S 5/423* (2013.01); *H01S 5/0206* (2013.01); *H01S 5/02476* (2013.01); *H01S 5/183* (2013.01); *H01S 5/18308* (2013.01)

(58) Field of Classification Search
CPC .... H01S 5/423; H01S 5/0206; H01S 5/02476; H01S 5/183; H01S 5/18308
See application file for complete search history.

(56) References Cited

U.S. PATENT DOCUMENTS

| 2009/0129419 A1* | 5/2009 | Matsushita | ......... H01S 5/04257 |
| | | | 372/45.01 |
| 2011/0176567 A1 | 7/2011 | Joseph | |
| 2017/0271851 A1* | 9/2017 | Hanaoka | ................ H01S 5/187 |

FOREIGN PATENT DOCUMENTS

| JP | H0738196 A | 2/1995 |
| JP | 3271291 B2 | 4/2002 |
| JP | 2015026640 A | 2/2015 |
| JP | 2017092160 A | 5/2017 |

(Continued)

OTHER PUBLICATIONS

Machine translation of JP2017-92160A (Year: 2017).*

*Primary Examiner* — Yuanda Zhang
(74) *Attorney, Agent, or Firm* — CKC & Partners Co., LLC

(57) ABSTRACT

A VCSEL device includes an N-type metal substrate and laser-emitting units on the N-type metal substrate. Each laser-emitting unit includes an N-type contact layer in contact with the N-type metal substrate; an N-type Bragg reflector layer in contact with the N-type contact layer; a P-type Bragg reflector layer above the N-type Bragg reflector layer; an active emitter layer between the P-type Bragg reflector layer and the N-type Bragg reflector layer; a current restriction layer between the active emitter layer and the P-type Bragg reflector layer; a P-type contact layer in contact with the P-type Bragg reflector layer; and an insulation sidewall surrounding all edges of the N-type and P-type Bragg reflector layers, the N-type and P-type contact layers, the active emitter layer and the current restriction layer. A P-type metal substrate has through holes each aligned with a current restriction hole of a corresponding laser-emitting unit.

17 Claims, 6 Drawing Sheets

(56) References Cited

FOREIGN PATENT DOCUMENTS

TW        200737629 A    10/2007
TW        201917967 A    5/2019

* cited by examiner

VERTICAL CAVITY SURFACE EMITTING LASER DEVICE

CROSS-REFERENCE TO RELATED APPLICATION

This application claims priority to China Application Serial Number 201911096307.5, filed Nov. 11, 2019, which is herein incorporated by reference in its entirety.

BACKGROUND

Field of Invention

The present disclosure relates to a vertical cavity surface emitting laser device.

Description of Related Art

The vertical cavity surface emitting laser device has many advantages in its manufacturing process than the edge-emitting laser device. For example, the vertical cavity surface emitting laser device can be tested and problem-solved in situ during any step of its manufacturing process because of the laser light emitting perpendicularly from a reaction area of the vertical cavity surface emitting laser device.

However, the vertical cavity surface emitting laser device is a high-power light-emitting device. If the light-emitting device is manufactured within a thin thickness, the heat dissipation and reliability issues must be solved.

SUMMARY

One aspect of the present disclosure is to provide a vertical cavity surface emitting laser (VCSEL) including an N-type metal substrate and a plurality of laser-emitting units on the N-type metal substrate. Each laser-emitting unit includes an N-type contact layer in contact with the N-type metal substrate; an N-type Bragg reflector layer in contact with the N-type contact layer; a P-type Bragg reflector layer above the N-type Bragg reflector layer; an active emitter layer between the P-type Bragg reflector layer and the N-type Bragg reflector layer; a current restriction layer between the active emitter layer and the P-type Bragg reflector layer, wherein the current restriction layer has a current restriction hole; a P-type contact layer in contact with the P-type Bragg reflector layer; and an insulation sidewall surrounding and contacting all edges of the N-type and P-type Bragg reflector layers, the N-type and P-type contact layers, the active emitter layer and the current restriction layer. A P-type metal substrate is in contact with the P-type contact layer of each laser-emitting unit, the P-type metal substrate has a plurality of through holes, and each through hole is aligned with the current restriction hole of a corresponding one of the laser-emitting units. An isolation block is connected to the insulation sidewall of the laser-emitting units, and located between the P-type metal substrate and the N-type metal substrate.

In one or more embodiments, the isolation block is not overlapped with the N-type contact layer.

In one or more embodiments, the P-type metal substrate has a portion between any immediately-adjacent two of the insulation sidewalls of the laser-emitting units.

In one or more embodiments, a vertical projection of the P-type Bragg reflector layer on the active emitter layer is substantially equal to a vertical projection of the N-type Bragg reflector layer on the active emitter layer.

In one or more embodiments, the isolation block has a thickness ranging from 0.5 micron to 5 microns.

In one or more embodiments, the P-type metal substrate has a thickness ranging from 3 microns to 15 microns.

In one or more embodiments, the N-type metal substrate has a thickness ranging from 30 microns to 100 microns.

In one or more embodiments, a distance between immediately-adjacent two of the insulation sidewalls of the laser-emitting units ranges from 5 microns to 50 microns.

In one or more embodiments, the insulation sidewall has a thickness ranging from 0.1 micron to 2 microns.

In one or more embodiments, a vertical projection of the P-type contact layer on the active emitter layer is substantially equal to a vertical projection of the N-type contact layer on the active emitter layer.

In summary, the vertical cavity surface emitting laser device disclosed herein has its semiconductor substrate removed, and the sidewalls of each laser-emitting unit are surrounded by a metal material, which is beneficial to the heat dissipation of the laser-emitting units during operation, thereby improving the overall heat dissipation efficiency of the vertical cavity surface-emitting laser device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
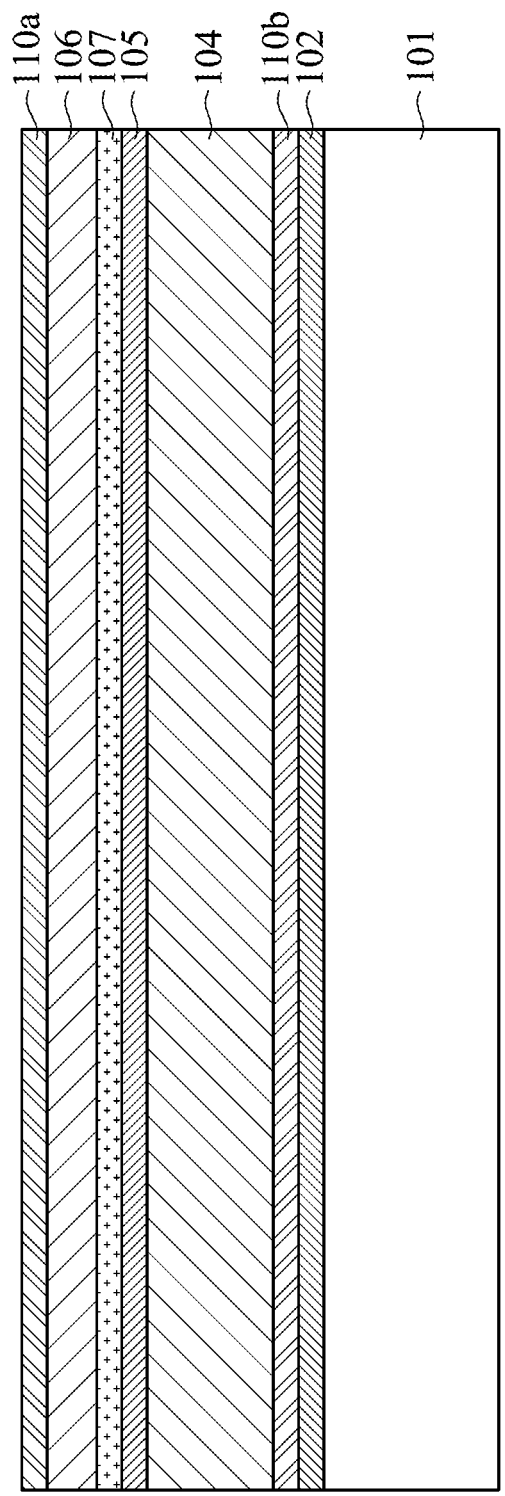
FIGS. 1-5 illustrate cross-sectional views of a method for manufacturing a vertical cavity surface emitting laser device at various stages in accordance with some embodiments of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Figure 6:
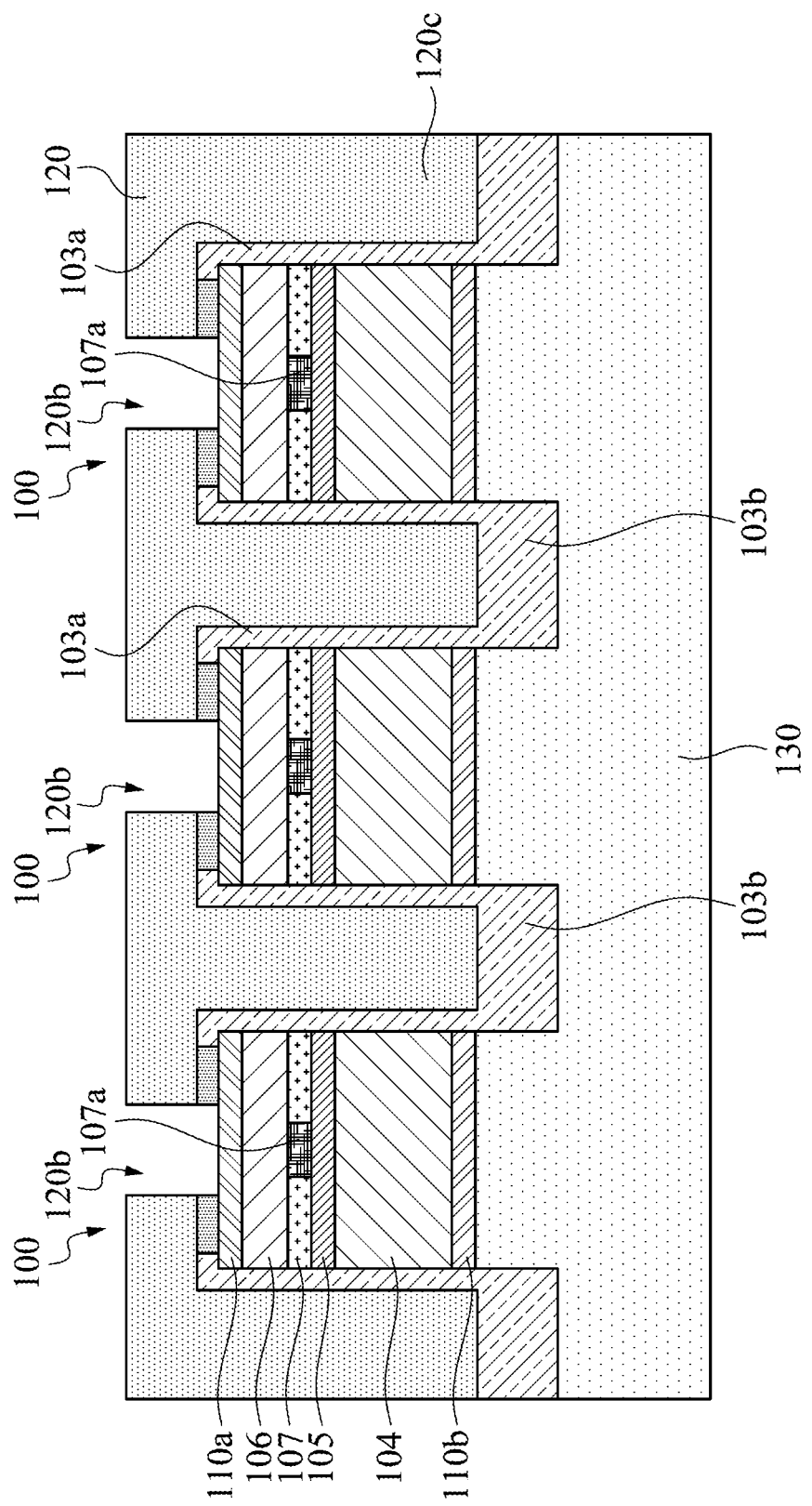
FIG. 6 illustrates a cross-sectional view of a vertical cavity surface emitting laser device in accordance with one embodiment of the present disclosure.

Reference is made to FIG. 6, which illustrates a cross-sectional view of a vertical cavity surface emitting laser device in accordance with one embodiment of the present disclosure. The vertical cavity surface emitting laser device has a plurality of laser-emitting units 100 on an N-type metal substrate 130. Each laser-emitting unit 100 includes an N-type contact layer 110*b*, an N-type Bragg reflector layer 104, a P-type Bragg reflector layer 106, an active emitter layer 105, a current restriction layer 107, a P-type contact layer 110a, an insulation sidewall 103a and a P-type metal substrate 120.

Within each laser-emitting unit 100, the N-type contact layer 110b is in contact with a common N-type metal substrate 130. The N-type Bragg reflector layer 104 is in contact with the N-type contact layer 110b. The P-type Bragg reflector layer 106 is located above the N-type Bragg reflector layer 104. The active emitter layer 105 is located between the P-type Bragg reflector layer 106 and the N-type Bragg reflector layer 104. The current restriction layer 107 is located between the active emitter layer 105 and the P-type Bragg reflector layer 106, and the current restriction layer 107 has a current restriction hole 107a. The P-type contact layer 110a is in contact with the P-type Bragg reflector layer 106. The insulation sidewall 103a surrounds and contacts all lateral edges of the N-type and P-type Bragg reflector layers (104, 106), the N-type and P-type contact layers (110b, 110a), the active emitter layer 105 and the current restriction layer 107, etc. The common P-type metal substrate 120 is in contact with the P-type contact layer 110a of each laser-emitting unit 100, and has a plurality of through holes 120b. Each through hole 120b is aligned with the current restriction hole 107a of a corresponding laser-emitting unit 100. An isolation block 103b is connected to the insulation sidewall 103a of the laser-emitting units 100, and located between the P-type metal substrate 120 and the N-type metal substrate 130.

In one or more embodiments, the N-type and P-type contact layers (110b, 110a) each has a thickness ranging from 0.01 micron to 0.5 microns, the N-type Bragg reflector layer 104 has a thickness ranging from 4 microns to 8 microns, the P-type Bragg reflector layer 106 has a thickness ranging from 2 microns to 4 microns, the active emitter layer 105 has a thickness ranging from 0.1 micron to 1 micron, and the current restriction layer 107 has a thickness ranging from 0.01 micron to 0.05 micron, but not being limited thereto.

In one or more embodiments, the isolation block 103b is located between the N-type metal substrate 130 and the N-type contact layer 110b, but not being limited thereto. The isolation block 103b is made from materials including SiOx, SiNx, AlOx, AlNx, TiOx, TiNx or TaOx, but not being limited thereto.

In one or more embodiments, the P-type metal substrate 120 has portions 120c located between the insulation sidewalls 103a of immediately-adjacent laser-emitting units 100, but not being limited thereto. The portions 120c of the P-type metal substrate 120 facilitates transferring heat generated by the operation of the laser-emitting unit 100 from the insulation sidewall 103a to the portions 120c of the P-type metal substrate 120. In one or more embodiments, the P-type metal substrate 120 and its one portion 120c located between two immediately-adjacent laser-emitting units 100 forms a T-shaped cross-section.

In one or more embodiments, a vertical projection of the P-type Bragg reflector layer 106 on the active emitter layer 105 is substantially equal to a vertical projection of the N-type Bragg reflector layer 104 on the active emitter layer 105, but not being limited thereto.

In one or more embodiments, the isolation block 103b has a thickness ranging from 0.5 micron to 5 microns, so as to improve the overall heat dissipation efficiency of the vertical cavity surface-emitting laser device, but not being limited thereto.

In one or more embodiments, the P-type metal substrate 120 has a thickness ranging from 3 microns to 15 microns so as to improve the overall heat dissipation efficiency of the vertical cavity surface-emitting laser device, but not being limited thereto.

In one or more embodiments, the active emitter layer 105 may be a multiple quantum well (Multiple Quantum Well, MQW) structure, but the active emitter layer of the present invention is not limited thereto.

In one or more embodiments, the N-type metal substrate 130 has a thickness ranging from 30 microns to 100 microns so as to improve the overall heat dissipation efficiency of the vertical cavity surface-emitting laser device, but not being limited thereto.

In one or more embodiments, insulation sidewall 103a has a thickness ranging from 0.1 micron to 2 microns so as to improve the overall heat dissipation efficiency of the vertical cavity surface-emitting laser device, but not being limited thereto.

In one or more embodiments, a vertical projection of the P-type contact layer 110a on the active emitter layer 105 is substantially equal to a vertical projection of the N-type contact layer 110b on the active emitter layer 105, but not being limited thereto.

Reference is made to FIGS. 1-5, which illustrate cross-sectional views of a method for manufacturing a vertical cavity surface emitting laser device at various stages in accordance with some embodiments of the present disclosure. In FIG. 1, an etch stop layer 102, an N-type contact layer 110b, an N-type Bragg reflector layer 104, an active emitter layer 105, a current restriction layer 107, a P-type Bragg reflector layer 106, and a P-type contact layer 110a are sequentially formed on a semiconductor substrate 101.

Figure 2:
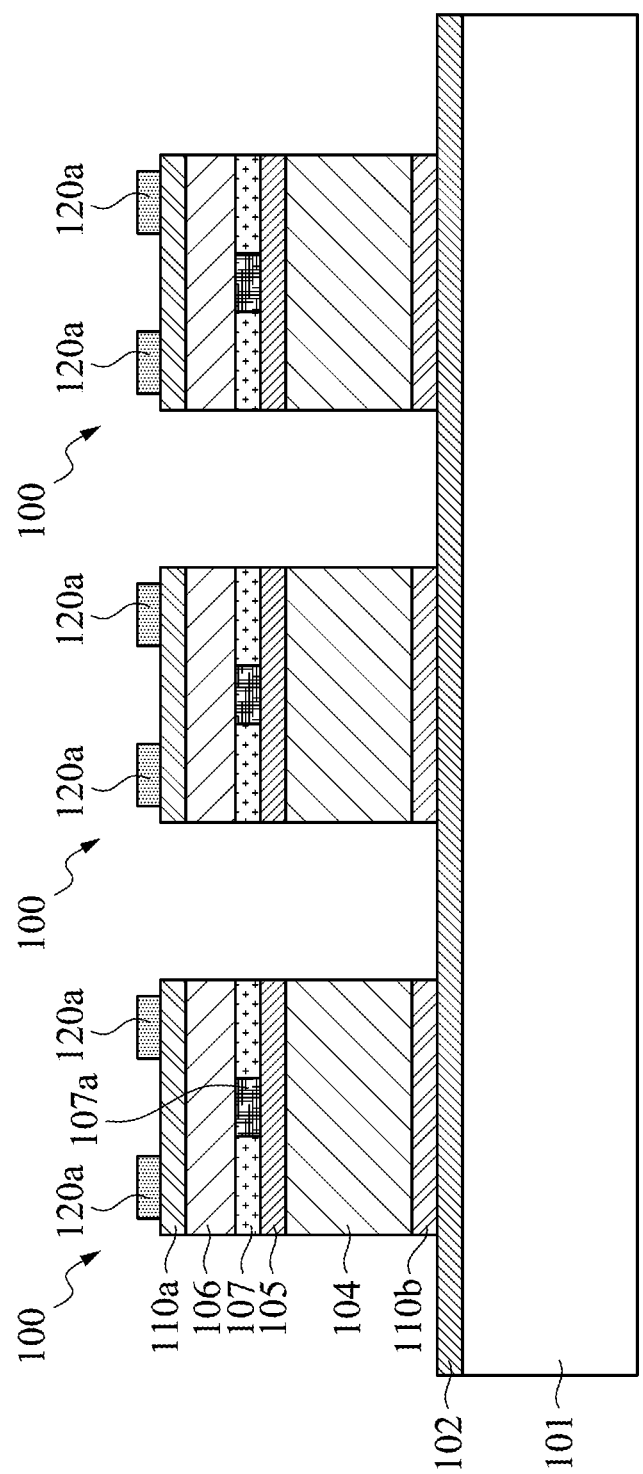

In FIG. 2, an etching process is performed to etch the layers to obtain a prototype of the laser-emitting units 100, and a metal seed layer 120a is formed on a top surface of the P-type contact layer 110a.

Figure 3:
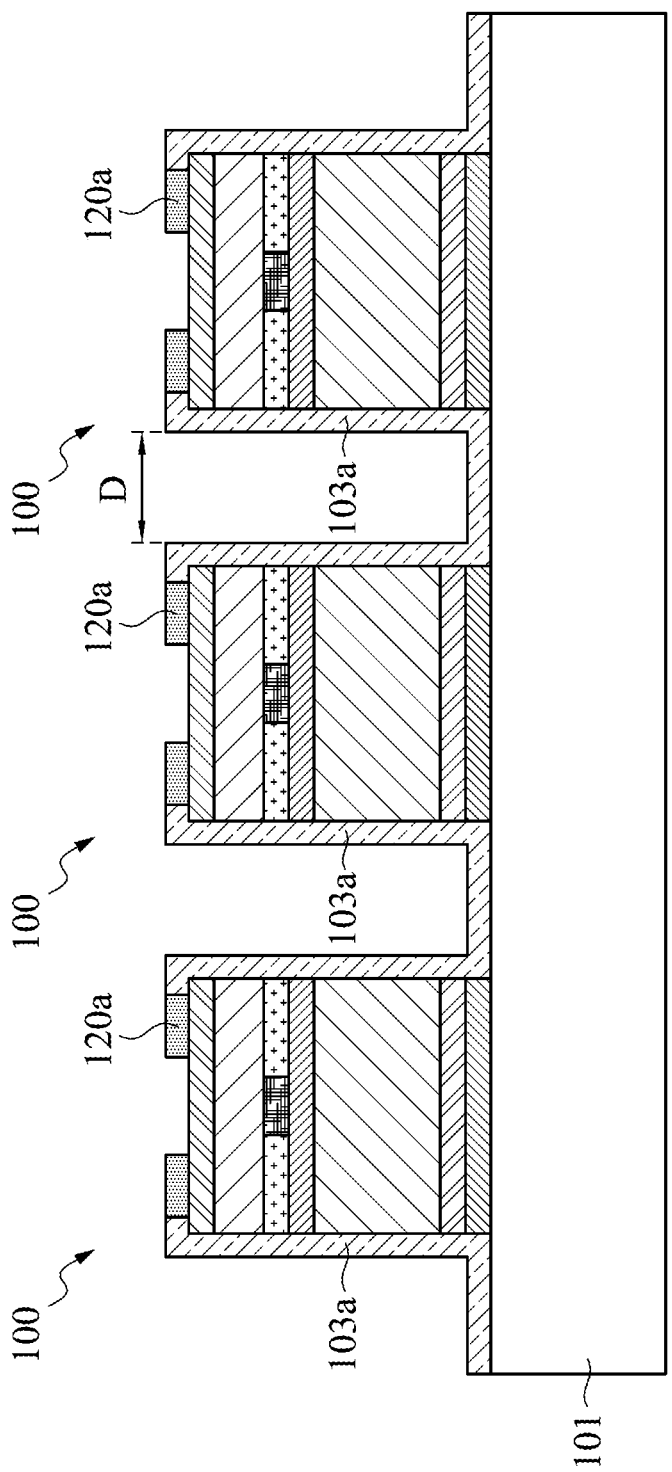

In FIG. 3, an insulation sidewall 103a is formed to surround and contact all lateral edges of the N-type and P-type Bragg reflector layers (104, 106), the N-type and P-type contact layers (110a, 110b), and the active emitter layer 105 and the current restriction layer 107, etc.

In one or more embodiments, a distance D between the insulation sidewalls 103a of immediately-adjacent laser-emitting units 100 ranges from 5 microns to 50 microns, but not being limited thereto.

Figure 4:
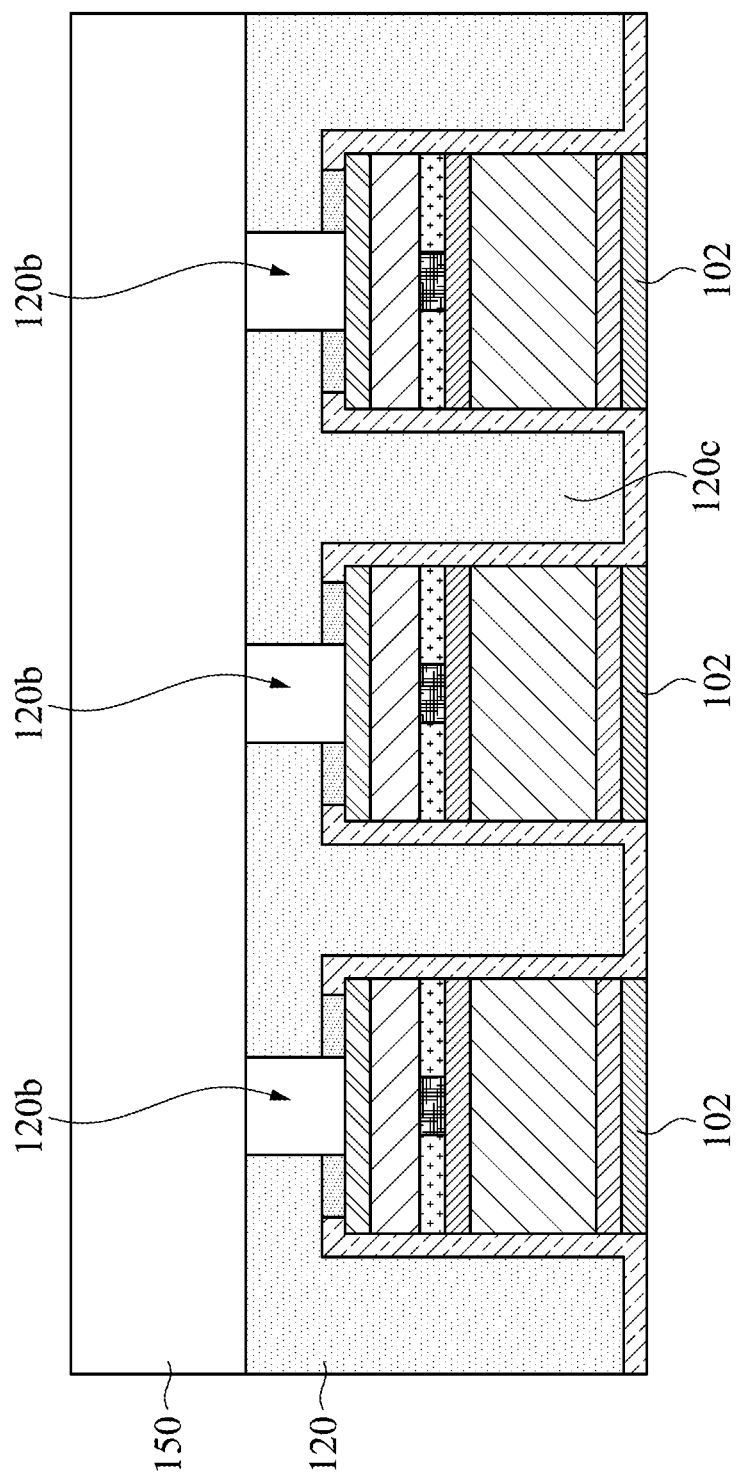

In FIG. 4, a metal plating process is performed on the basis of the metal seed layer 120a to form a P-type metal substrate 120, and a through hole 120b is formed as a light emitting hole for each laser-emitting unit 100. Each through hole 120b is aligned with a current restriction hole 107a of the corresponding laser-emitting unit 100. Next, a temporary substrate 150 is used to adhere to the upper surface of the P-type metal substrate 120, and the semiconductor substrate 101 is removed by etching.

Figure 5:
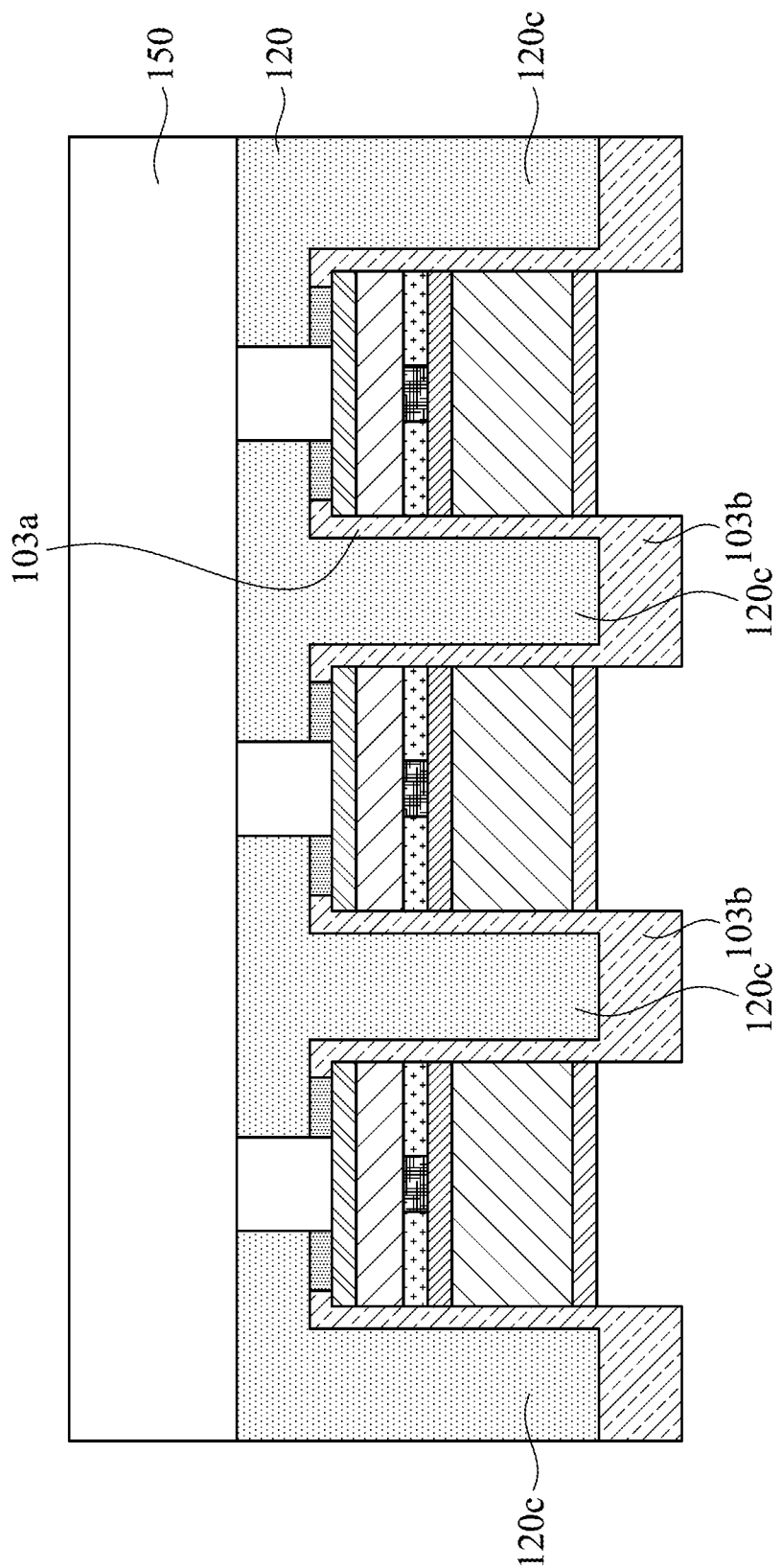

In FIG. 5, the etch stop layer 102 is removed by etching, and a thickness of the isolation block 103b is increased. In one or more alternative embodiments, the thickness of the isolation block 103b ranges from 0.5 micron to 5 microns. The isolation block 103b is not overlapped with the N-type contact layer 110b or a projection of other layers, e.g., layers 104-107, on the N-type contact layer 110b. Therefore, the N-type metal substrate 130 (referring to FIG. 6) and the N-type contact layer 110b can have a larger contact area, which is beneficial to the conduction of electricity and heat.

In FIG. 6, a common N-type metal substrate 130 is formed to contact the N-type contact layer 110b of each laser-emitting unit 100, and the temporary substrate 150 is removed to form a vertical cavity surface-emission type laser device.

In summary, the vertical cavity surface emitting laser device disclosed herein has its semiconductor substrate removed, and the sidewalls of each laser-emitting unit are surrounded by a metal material, which is beneficial to the heat dissipation of the laser-emitting units during operation, thereby improving the overall heat dissipation efficiency of the vertical cavity surface-emitting laser device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A vertical cavity surface emitting laser device comprising:
   an N-type metal substrate;
   a plurality of laser-emitting units disposed on the N-type metal substrate, each laser-emitting unit comprising:
      an N-type contact layer in contact with the N-type metal substrate;
      an N-type Bragg reflector layer in contact with the N-type contact layer;
      a P-type Bragg reflector layer disposed above the N-type Bragg reflector layer;
      an active emitter layer disposed between the P-type Bragg reflector layer and the N-type Bragg reflector layer;
      a current restriction layer disposed between the active emitter layer and the P-type Bragg reflector layer, wherein the current restriction layer has a current restriction hole;
      a P-type contact layer in contact with the P-type Bragg reflector layer; and
      an insulation sidewall surrounding and contacting all edges of the N-type and P-type Bragg reflector layers, the N-type and P-type contact layers, the active emitter layer and the current restriction layer;
   a P-type metal substrate in contact with the P-type contact layer of each laser-emitting unit, the P-type metal substrate has a plurality of through holes, each through hole is aligned with the current restriction hole of a corresponding one of the laser-emitting units; and
   an isolation block connected to the insulation sidewall of the laser-emitting units, and disposed between the P-type metal substrate and the N-type metal substrate, wherein the isolation block has a thickness ranging from 0.5 micron to 5 microns.

2. The vertical cavity surface emitting laser device of claim 1, wherein the isolation block is not overlapped with the N-type contact layer.

3. The vertical cavity surface emitting laser device of claim 1, wherein the P-type metal substrate has a portion disposed between any immediately-adjacent two of the insulation sidewalls of the laser-emitting units.

4. The vertical cavity surface emitting laser device of claim 1, wherein a vertical projection of the P-type Bragg reflector layer on the active emitter layer is substantially equal to a vertical projection of the N-type Bragg reflector layer on the active emitter layer.

5. The vertical cavity surface emitting laser device of claim 1, wherein the P-type metal substrate has a thickness ranging from 3 microns to 15 microns.

6. The vertical cavity surface emitting laser device of claim 1, wherein the N-type metal substrate has a thickness ranging from 30 microns to 100 microns.

7. The vertical cavity surface emitting laser device of claim 1, wherein a distance between immediately-adjacent two of the insulation sidewalls of the laser-emitting units ranges from 5 microns to 50 microns.

8. The vertical cavity surface emitting laser device of claim 1, wherein the insulation sidewall has a thickness ranging from 0.1 micron to 2 microns.

9. A vertical cavity surface emitting laser device comprising:
   an N-type metal substrate;
   a plurality of laser-emitting units disposed on the N-type metal substrate, each laser-emitting unit comprising:
      an N-type contact layer in contact with the N-type metal substrate;
      an N-type Bragg reflector layer in contact with the N-type contact layer;
      a P-type Bragg reflector layer disposed above the N-type Bragg reflector layer;
      an active emitter layer disposed between the P-type Bragg reflector layer and the N-type Bragg reflector layer;
      a current restriction layer disposed between the active emitter layer and the P-type Bragg reflector layer, wherein the current restriction layer has a current restriction hole;
      a P-type contact layer in contact with the P-type Bragg reflector layer; and
      an insulation sidewall surrounding and contacting all edges of the N-type and P-type Bragg reflector layers, the N-type and P-type contact layers, the active emitter layer and the current restriction layer;
   a P-type metal substrate in contact with the P-type contact layer of each laser-emitting unit, the P-type metal substrate has a plurality of through holes, each through hole is aligned with the current restriction hole of a corresponding one of the laser-emitting units; and
   an isolation block connected to the insulation sidewall of the laser-emitting units, and disposed between the P-type metal substrate and the N-type metal substrate, wherein a vertical projection of the P-type contact layer on the active emitter layer is substantially equal to a vertical projection of the N-type contact layer on the active emitter layer.

10. The vertical cavity surface emitting laser device of claim 9, wherein the isolation block is not overlapped with the N-type contact layer.

11. The vertical cavity surface emitting laser device of claim 9, wherein the P-type metal substrate has a portion disposed between any immediately-adjacent two of the insulation sidewalls of the laser-emitting units.

12. The vertical cavity surface emitting laser device of claim 9, wherein a vertical projection of the P-type Bragg reflector layer on the active emitter layer is substantially equal to a vertical projection of the N-type Bragg reflector layer on the active emitter layer.

13. The vertical cavity surface emitting laser device of claim 9, wherein the P-type metal substrate has a thickness ranging from 3 microns to 15 microns.

14. The vertical cavity surface emitting laser device of claim 9, wherein the N-type metal substrate has a thickness ranging from 30 microns to 100 microns.

15. The vertical cavity surface emitting laser device of claim 9, wherein a distance between immediately-adjacent two of the insulation sidewalls of the laser-emitting units ranges from 5 microns to 50 microns.

16. The vertical cavity surface emitting laser device of claim 9, wherein the insulation sidewall has a thickness ranging from 0.1 micron to 2 microns.

17. The vertical cavity surface emitting laser device of claim 9, wherein the isolation block has a thickness ranging from 0.5 micron to 5 microns.

* * * * *